(12) United States Patent
Yeh

(10) Patent No.: US 6,485,306 B1
(45) Date of Patent: Nov. 26, 2002

(54) LOCUS-RECORDABLE PORTABLE HANDWRITING DEVICE

(75) Inventor: Chia-Jui Yeh, Taipei (TW)

(73) Assignee: AIPTEK International Inc., Hsinchu (TW)

( * ) Notice: Subject to any disclaimer, the term of this patent is extended or adjusted under 35 U.S.C. 154(b) by 0 days.

(21) Appl. No.: 09/902,029

(22) Filed: Jul. 10, 2001

(51) Int. Cl.[7] ................................. G09B 19/00
(52) U.S. Cl. ................ 434/155; 434/162; 434/169; 382/312
(58) Field of Search ................ 434/155, 162, 434/169, 307 R, 308; 382/312–316, 119, 120, 187, 184; 345/156, 169, 179

(56) References Cited

U.S. PATENT DOCUMENTS

| | | | | |
|---|---|---|---|---|
| 4,262,281 A | * | 4/1981 | Buckle et al. | 382/315 |
| 4,633,436 A | * | 12/1986 | Flurry | 434/162 |
| 4,866,646 A | * | 9/1989 | Nakamura et al. | 708/141 |
| 5,202,844 A | * | 4/1993 | Kamio et al. | 708/141 |
| 5,587,560 A | * | 12/1996 | Crooks et al. | 382/119 |
| 5,612,720 A | * | 3/1997 | Ito et al. | 345/179 |
| 5,730,602 A | * | 3/1998 | Gierhart et al. | 434/155 |
| 6,229,919 B1 | * | 5/2001 | Hirayama | 382/187 |

* cited by examiner

Primary Examiner—Hieu T. Vo

(57) ABSTRACT

A locus-recordable portable handwriting device for recording locus of a wireless stylus is provided with function of memory-page scrolling, locus color switching, data clearance, establishment of a built-in power source, etc. The handwriting device comprises a microprocessor, a memory, a power control unit, a display unit, a universal serial bus (USB), a data clearance switch, a memory-page code switching switch, and a locus-color switching switch.

3 Claims, 3 Drawing Sheets

LOCUS-RECORDABLE PORTABLE HANDWRITING DEVICE

FIELD OF THE INVENTION

This invention relates to a locus-recordable portable handwriting device, in which a plurality of antennas will receive electromagnetic waves emitted from a wireless stylus on a handwriting tablet and a microcomputer is supposed to scan over all the antennas and calculate the locus of the stylus on surface of the handwriting device and sequentially store the point coordinates of the locus in the memory.

BACKGROUND OF THE INVENTION

A conventional handwriting device for data input of a wireless stylus is generally an input device with cord, namely, the handwriting device must be connected with a computer to obtain power source and transmit the handwriting data to the computer for procession and display of the results on the computer monitor. Therefore, the conventional handwriting tablet is considered nonportable and incapable of recording locus of the wireless stylus.

SUMMARY OF THE INVENTION

The primary object of this invention is to provide a locus-recordable portable handwriting device, which can function to record locus of a wireless stylus, switch memory pages, switch locus colors, clear data, establish a built-in power supply, and enhance portability of the device.

In order to realize abovesaid object, the locus-recordable portable handwriting device of this invention comprises a microprocessor, a memory, a power-control unit, a display unit, a data-clearance switch, a memory-page scrolling switch, and a locus-color switching switch.

For more detailed information regarding advantages or features of this invention, at least an example of preferred embodiment will be elucidated below with reference to the annexed drawings.

DETAILED DESCRIPTION OF THE INVENTION

Figure 1:
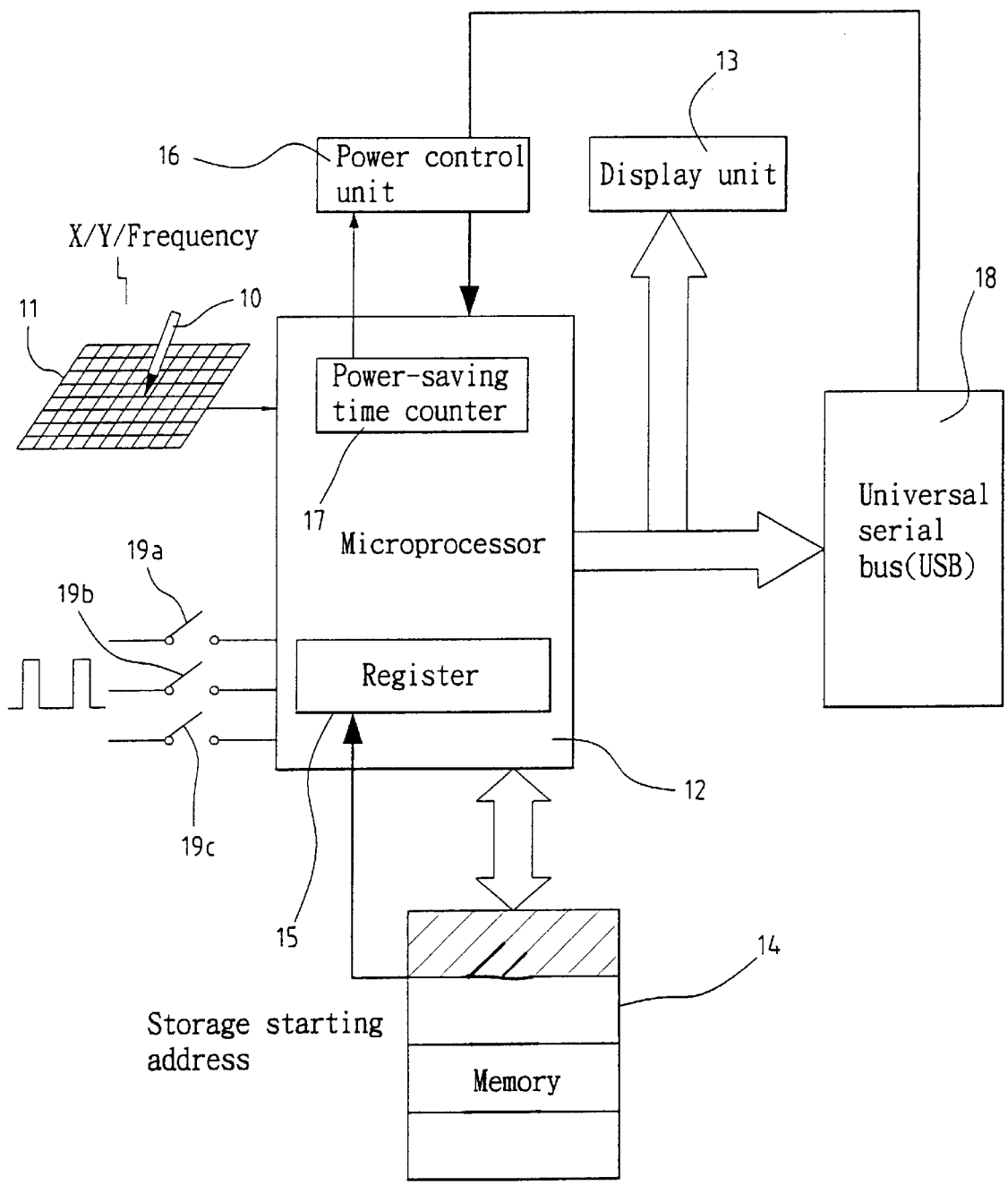
FIG. 1 is a schematic block diagram showing the internal connection of this invention.

As indicated in FIG. 1—a schematic block diagram showing the internal interaction of a locus-recordable portable handwriting device of this invention—when a wireless stylus 10 is emitting electromagnetic waves, the X-axis and Y-axis antennas in a detector 11 are induced to receive the same, and meanwhile, a microprocessor 12 is programmed to scan all the antennas sequentially to obtain a set of parameters (X/Y/Frequency) that expresses the positional X/Y coordinates and the frequency of the electromagnetic waves where the stylus 10 is located. After processing of the set of parameters by the microprocessor is made, the locus data is presented on a display unit 13 for observation of a user, and simultaneously, the microprocessor 12 also transmits the locus data to a memory 14 for storage. Before doing so, the microprocessor 12 will firstly read the content of a built-in register 15 to catch an initial address of a blank page in the memory 14 so that the microprocessor 12 will write the memory 14 starting from an address mapping with the content. When the "write" action is completed, the address for next "write" is then returned to the register 15.

A power control unit 16 shown in FIG. 1 is provided to supply power to the microprocessor 12 and meanwhile wait for a signal from a power management time counter 17 built in the microprocessor 12. When the microprocessor 12 is idle or goes to sleep, the power management time counter 17 is supposed to give a signal to the power control unit 16 to cut off the power supply for power saving.

A data-clearance switch 19a, a memory-page scrolling switch 19b, and a locus-color switching switch 19c are hardware interrupt driving switches or keys, and they are provided to control the microprocessor 12 for clearing data in the memory 14; or switching the present memory page to a designated page so as to proceed action of "access", "delete", or "insert", and meanwhile show the page code on the display unit 13; or changing the existing locus color, respectively.

A universal serial bus (USB) 18 serves as a communication interface for a personal computer (PC), and the data stored in the memory 14 can be transmitted to the personal computer via the USB 18. Also, the USB 18 is connected with the power control unit 16, so that when a handwriting device exchanges data with the personal computer, the power control unit 16 will accept the external power source of the personal computer to thereby supply power to the microprocessor 12 and charge itself.

Figure 2:
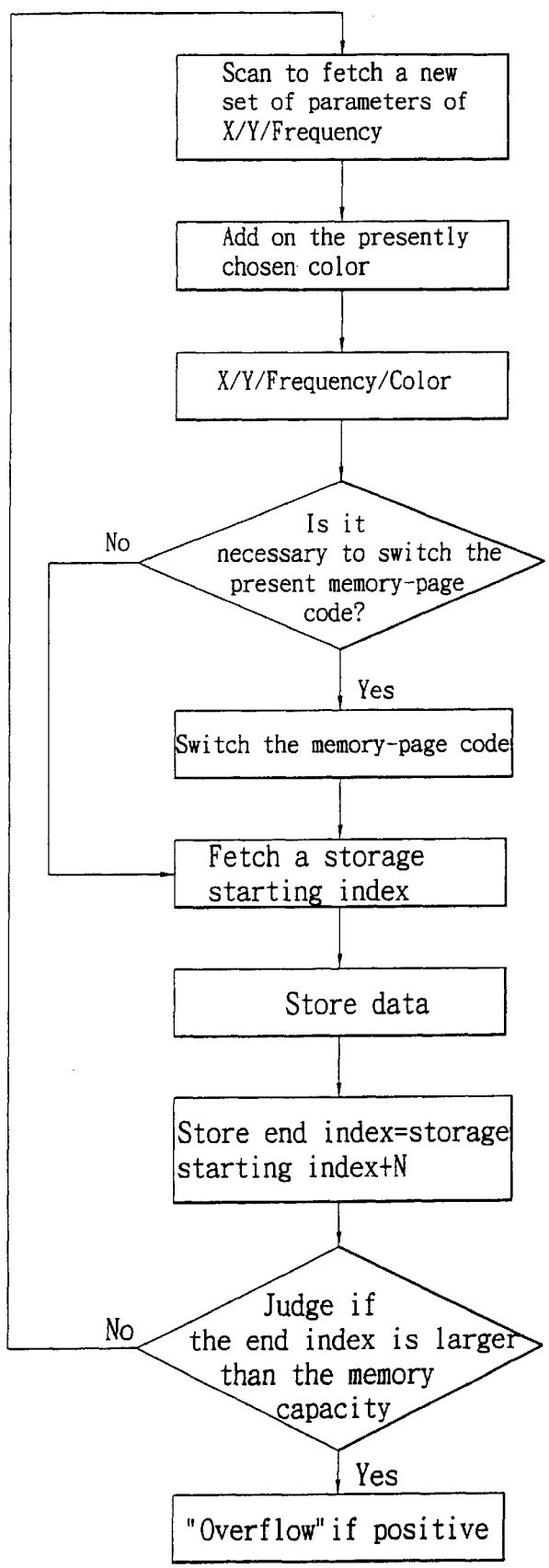
FIG. 2 is a flowchart corresponding to the block diagram shown in FIG. 1.

According to FIG. 2—a flowchart corresponding to the block diagram shown in FIG. 1—the microprocessor 12 will:

firstly scan all the antennas; then, count the X-/Y-coordinates and the electromagnetic frequency of the stylus 10 moving on a handwriting device;

choose the locus color;

decide whether switching the present memory page is desired or not, if "Yes", switch it to a blank page and fetch the initial address thereof as a starting index for data storage, or take the starting address of the present memory page as the starting index for data storage otherwise;

store data covering N memory addresses in size, where N is a variable;

store the end index (the starting index+N);

judge whether the end index is larger than the memory capacity in value; if positive, "overflow" is meant, otherwise, go back to the initial address of the flowchart for continuation.

Figure 3:
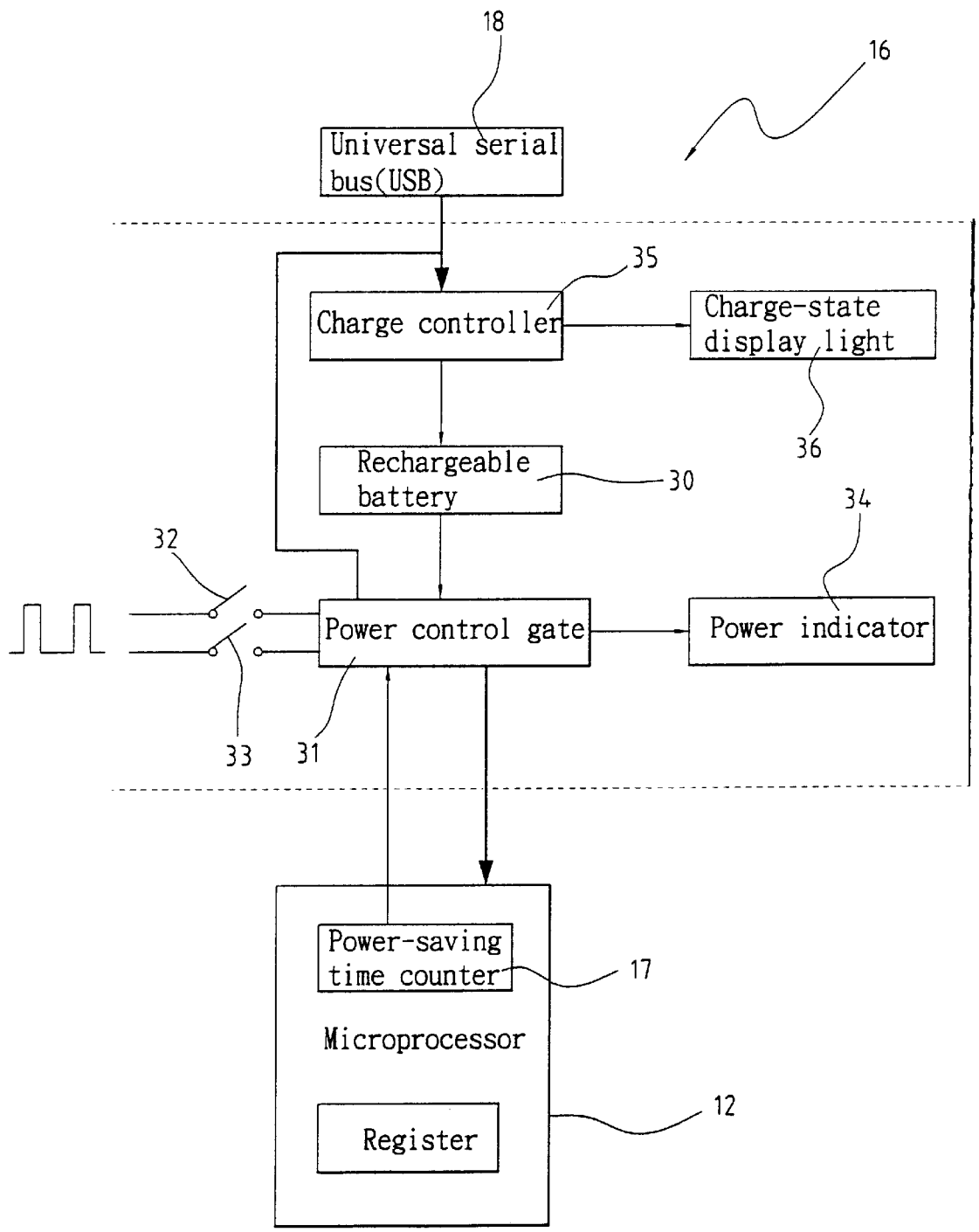
FIG. 3 is a block diagram showing a built-in power supply of this invention.

FIG. 3 is a block diagram showing a built-in power supply of this invention. When the handwriting device is separated from the PC, a rechargeable battery 30 will supply power to the power control unit 16 and when the handwriting device joins the PC, an external power source at the PC end would supply power to the power control unit 16 through the USB 18, and at this time, the rechargeable battery 30 will discharge no more but to be recharged instead.

A power control gate 31 shown in FIG. 3 is controlled by a power supply switch 32 and a reset switch 33 for deciding whether power should be transferred to the microprocessor 12 or reset and it is also arranged to receive an external interrupt signal from the power management time counter 17. When the microprocessor 12 is idle or enters a "sleep" mode, the power management time counter 17 is supposed to provide a signal to the power control gate 31 and request the latter to stop power transfer. A power indicator 34 is employed to indicate the present state of power as of "start", "shut down" or "stand-by".

A charge controller 35 shown in FIG. 3 is powered by an external power source of a PC on the one hand and charge the rechargeable battery 30 on the other hand, wherein a charge-state display light 36 is employed to show the present charge state.

In the above described, at least one preferred embodiment has been described in detail with reference to the drawings annexed, and it is apparent that numerous variations or-modifications may be made without departing from the true spirit and scope thereof, as set forth in the claims below.

What is claimed is:

1. A locus-recordable portable handwriting device, which is a portable computer handwriting device for recording a wireless stylus' locus, comprising:

a microprocessor for fetching a set of parameters of the wireless stylus moving on the computer handwriting device and treating the same to become locus data;

a power-saving time counter built in the microprocessor for judging whether the microprocessor is idle or not;

a register also built in the microprocessor for recording a storage starting index;

a memory for storing the locus data treated by the microprocessor;

a display unit for indicating the wireless stylus' locus and a page code of the memory;

a power control unit for supplying power to the microprocessor;

a data clearance switch for controlling the microprocessor to clear the data stored in the memory;

a memory-page scrolling switch for controlling the microprocessor to switch the memory to a user's designated page;

a locus-color switching switch for controlling the microprocessor to change the present locus color; and a universal serial bus (USB) serving for a personal computer's communication interface.

2. The handwriting device according to claim 1, wherein the power control unit further comprises:

a rechargeable battery for power storage;

a charge controller powered by an external power source of a personal computer for charging the rechargeable battery;

a power control gate designed to serve as a power control circuit and receive an external interrupt signal from the power-saving time counter;

a power switch for ON/OFF operation of the power control gate in order to control power transfer to the microprocessor;

a reset switch for ON/OFF operation of the power control gate in order to control reset of the power supply;

a charge-state display light for showing the present charge state; and a power indicator for showing the present state of power.

3. The handwriting device according to claim 1, wherein the set of parameters expresses the X-/Y-coordinates and the frequency of electromagnetic waves of the wireless stylus in the handwriting device.

* * * * *